US008191674B2

(12) United States Patent
Thompson

(10) Patent No.: US 8,191,674 B2
(45) Date of Patent: Jun. 5, 2012

(54) ACOUSTIC LOADING DEVICE FOR LOUDSPEAKERS

(75) Inventor: Ambrose Thompson, Aylesbury (GB)

(73) Assignee: Martin Audio Limited (GB)

( * ) Notice: Subject to any disclaimer, the term of this patent is extended or adjusted under 35 U.S.C. 154(b) by 10 days.

(21) Appl. No.: 11/918,160

(22) PCT Filed: Apr. 21, 2006

(86) PCT No.: PCT/GB2006/001461
§ 371 (c)(1),
(2), (4) Date: Nov. 21, 2007

(87) PCT Pub. No.: WO2006/111763
PCT Pub. Date: Oct. 26, 2006

(65) Prior Publication Data

US 2009/0277713 A1 Nov. 12, 2009

(30) Foreign Application Priority Data

Apr. 21, 2005 (GB) .................................. 0508083.3

(51) Int. Cl.
*G10K 11/00* (2006.01)
*G10K 13/00* (2006.01)
*H04R 1/02* (2006.01)
*H04R 5/02* (2006.01)
*H05K 5/00* (2006.01)

(52) U.S. Cl. ........ 181/186; 181/145; 181/148; 181/152; 181/157; 181/159; 181/188; 381/301; 381/304; 381/305; 381/339

(58) Field of Classification Search .................. 181/186, 181/145, 157, 188; 381/301, 304
See application file for complete search history.

(56) References Cited

U.S. PATENT DOCUMENTS

| | | | | |
|---|---|---|---|---|
| 858,763 | A * | 7/1907 | Seaman | 181/186 |
| 918,111 | A * | 4/1909 | Woods | 181/186 |
| 1,865,735 | A * | 7/1932 | Wolff | 181/157 |
| 2,001,089 | A | 5/1935 | Blattner | |
| 2,135,610 | A | 11/1938 | Wente | |
| 2,537,141 | A * | 1/1951 | Klipsch | 181/187 |

(Continued)

FOREIGN PATENT DOCUMENTS

GB 404 937 A 1/1934

(Continued)

OTHER PUBLICATIONS

British Search Report dated Oct. 20, 2005.

(Continued)

*Primary Examiner* — Lincoln Donovan
*Assistant Examiner* — Christina Russell
(74) *Attorney, Agent, or Firm* — Harness, Dickey & Pierce, P.L.C.

(57) ABSTRACT

A loudspeaker horn includes a pair of opposed flared sides defining a passage diverging to a mouth, and a vane positioned in the passage for steering sound waves through the passage. The vane may have a straight configuration and be either centrally located between the flared sides or laterally offset in the diverging passage. The vane may be fixed in position or, more preferably, be pivotable so as to be adjustable before each new use according to conditions at that use. The horn may be part of a horn unit that includes a funnel for feeding sound to the horn, and the horn or horn unit may be part of a horn loudspeaker.

18 Claims, 3 Drawing Sheets

U.S. PATENT DOCUMENTS

| | | | | |
|---|---|---|---|---|
| 2,646,851 | A * | 7/1953 | Chapman et al. | 181/155 |
| 3,105,113 | A * | 9/1963 | Olson | 381/301 |
| 3,903,989 | A * | 9/1975 | Bauer | 181/144 |
| 4,091,891 | A | 5/1978 | Hino et al. | |
| 4,194,590 | A * | 3/1980 | Anderson et al. | 181/186 |
| 4,266,092 | A * | 5/1981 | Barker, III | 381/305 |
| 4,390,078 | A * | 6/1983 | Howze et al. | 181/185 |
| 5,117,463 | A * | 5/1992 | Oyaba et al. | 381/347 |
| 5,140,641 | A * | 8/1992 | Danley et al. | 381/339 |
| 6,394,223 | B1 * | 5/2002 | Lehman | 181/152 |
| 7,835,537 | B2 * | 11/2010 | Cheney | 381/337 |
| 2004/0216948 | A1 * | 11/2004 | Meyer et al. | 181/188 |
| 2004/0245043 | A1 * | 12/2004 | Noselli et al. | 181/176 |

FOREIGN PATENT DOCUMENTS

| | | | |
|---|---|---|---|
| GB | 1088756 | | 10/1967 |
| GB | 1572024 | | 7/1980 |
| GB | 2191606 | A * | 12/1987 |
| WO | 03088206 | | 10/2003 |

OTHER PUBLICATIONS

The New Encyclopedia Britannica, vol. 27, pp. 561-562.

* cited by examiner

ACOUSTIC LOADING DEVICE FOR LOUDSPEAKERS

CROSS-REFERENCE TO RELATED APPLICATIONS

This application is a 371 National Stage of International application No. PCT/GB2006/001461, filed Apr. 21, 2006 and published as WO 2006/111763 A1 on Oct. 26, 2006. This application claims the benefit of GB 0508083.3, filed Apr. 21, 2005. The disclosure(s) of the above applications are incorporated herein by reference.

The subject invention relates to a loudspeaker device having a means for changing sound dispersion and, more particularly, to a loudspeaker horn having means for steering the path of sound waves for changing sound dispersed from the downstream end of the horn.

When a loudspeaker is coupled to a horn the dispersion of sound from the loudspeaker is modified. It is possible for those skilled in the art to shape a horn device in such a way as to produce a constant dispersion of sound over a wide frequency range and over given angles in a horizontal and vertical plane. Conventional horn configurations are compromised at the upper frequency range of the associated loudspeaker, where the achieved sound dispersion tends to narrow and deviate from the constant sound dispersion that is achieved at lower frequencies.

The subject invention is intended to extend the range of frequency over which constant sound dispersion (directivity) is attained. This is accomplished by adding, at a specific location on a horn, a planar strip, i.e. vane, that has been found to improve sound dispersion. By modifying the position of the strip, sound dispersion can be steered in one plane with respect to the main axis of propagation. This has the advantage that the sound can be steered on leaving the horn toward any change in, for instance, audience position at a concert, and avoids the need for repositioning of (usually heavy) loudspeaker equipment to which the horn is attached.

In one form, the subject invention is an acoustic loading device for a loudspeaker, the device having a passage diverging to a mouth and having at least one vane disposed across the divergent passage so as in operation to affect the dispersion of sound from the device.

In a particularly preferred embodiment, the diverging passage is defined by a pair of opposed flared sides, and in such case each vane may be located between the flared sides.

The device of the particularly preferred embodiment may have a single vane that is fixed to extend parallel to the symmetrical axis extending intermediate the flared sides, and the vane may be fixed to extend on the intermediate symmetrical axis.

In the device of the particularly preferred embodiment, the orientation of each vane relative to the flared sides may be adjustable. In particular, each vane may be pivotable about a pivot axis that extends parallel to the flared sides. Such device may have only a single vane that has a pivot axis on, or proximate, the symmetrical axis extending intermediate the flared sides. Alternatively, such device may have only a single vane that has a pivot axis located between one of the flared sides and the symmetrical axis extending intermediate the flared sides. In a device having one or more pivotable vanes, the pivot axis of each vane may be proximate an upstream end of the vane.

An upstream end of each vane may be downstream of an upstream end of the flared sides.

A downstream end of each vane may be downstream of a downstream end of the flared sides.

Each vane may have a thickness no greater than approximately one-tenth of the minimum wavelength of sound to be dispersed by the device. With particular application to high frequencies, each vane may have a thickness no greater than approximately 1 mm.

The device may be oriented in use such that each vane extends in a generally vertical direction.

The device may have a plurality of vanes, and the pivot axes of the plurality of vanes may extend generally parallel to each other.

Each vane may be straight.

Each flared side may have a continuous arcuate contour or a stepped arcuate contour.

The device may be a horn for a horn loudspeaker.

In another form, the subject invention is a horn unit that includes the device in the form of the horn, and also includes a funnel connected to an upstream end of the horn.

In one dimension the funnel may be of constant width.

The funnel may be of increasing depth in a direction normal to the one dimension, the depth increasing with decreasing distance from the upstream end of the horn.

In a further form, the subject invention is a horn loudspeaker having any of preceding forms of horn or any of the preceding forms of horn unit.

Preferred features of the present invention will now be described, by way of example only, with reference to the accompanying drawings, in which:—

The behaviour of four embodiments of the subject invention were investigated. Two of the four embodiments (the first and second) were found to be preferable, and are subsequently described more fully with respect to the drawings. Comments are also made, however, on the third and fourth embodiments that were investigated.

Figure 1:
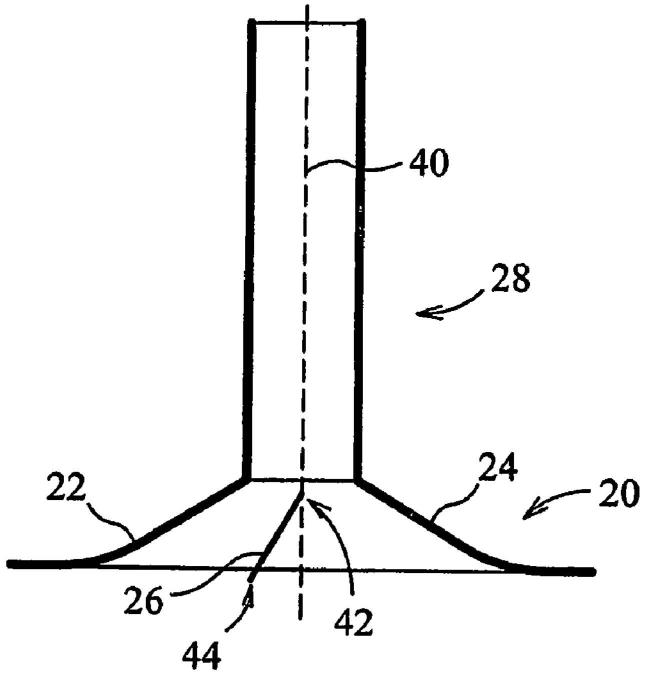
FIG. 1 is a planar cross-section of a first embodiment of a horn unit of the subject invention, the horn unit having a central linear vane extending at an angle to an intermediate symmetrical axis of the flared sides of the horn.
Figure 3:
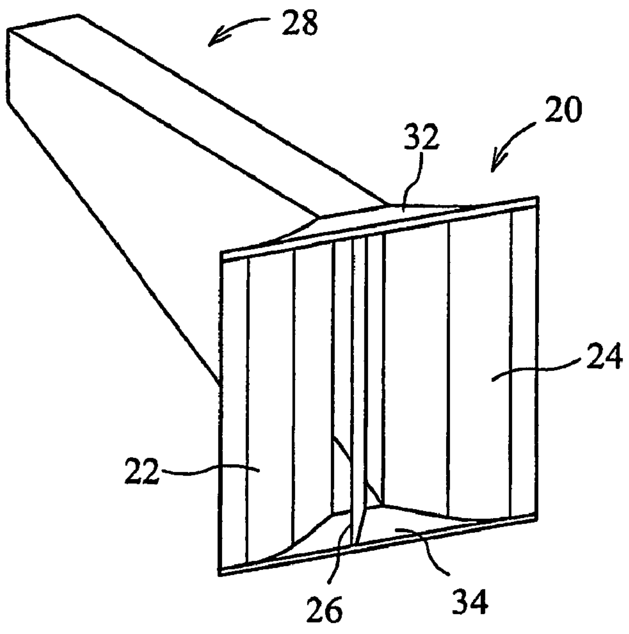
FIG. 3 is a left frontal perspective view of the horn unit of the first embodiment.
Figure 4:
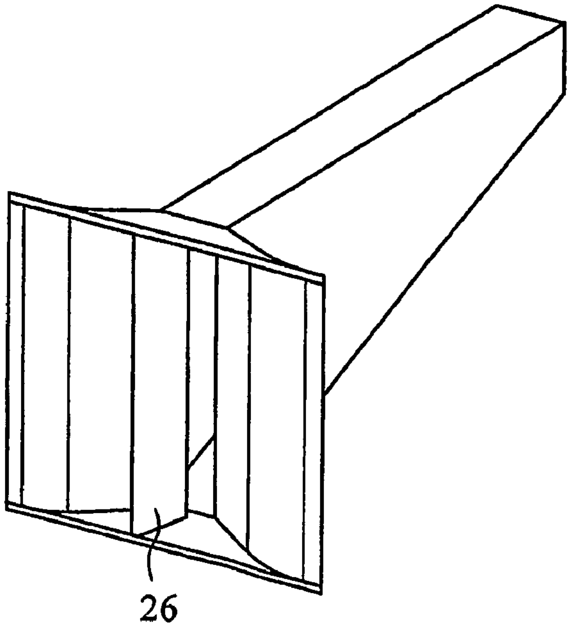
FIG. 4 is a right frontal perspective view of the horn unit of the first embodiment.

FIGS. 1, 3 and 4 relate to a horn unit in a first embodiment of the subject invention. That horn unit, shown in plan view in FIG. 1, includes a horn 20 with a first arcuate flared side 22 and a second arcuate flared side 24, and also includes a pivotable vane 26 positioned intermediate the flared sides 22 and 24. The horn unit additionally includes a funnel 28 connected to an upstream end of the horn 20. As depicted in FIGS. 3 and 4, the cross-section of the horn 20 of FIG. 1 remains constant between a first (upper) bounding member 32 and a second (lower) bounding member 34, with the first flared side 22 and the second flared side 24 having their ends fixed to bounding member 32 and bounding member 34. The vane 26 is straight and is pivotally mounted on the bounding members 32 and 34 such that it extends at an angle to the intermediate symmetrical axis 40 between the flared sides 22 and 24, with the upstream end 42 of the vane 26 forming a pivot axis on the symmetrical axis 40. The angle of pivot of the vane 26 is adjusted prior to operation of a connected loudspeaker according to external conditions. This allows for sound to be re-directed at concerts according to audience location, with the benefit that repositioning of the loudspeaker itself (which may be a heavy piece of equipment) is avoided. The steering of sound waves from the horn allows sound levels (particularly at higher frequencies) to be maintained.

Figure 2:
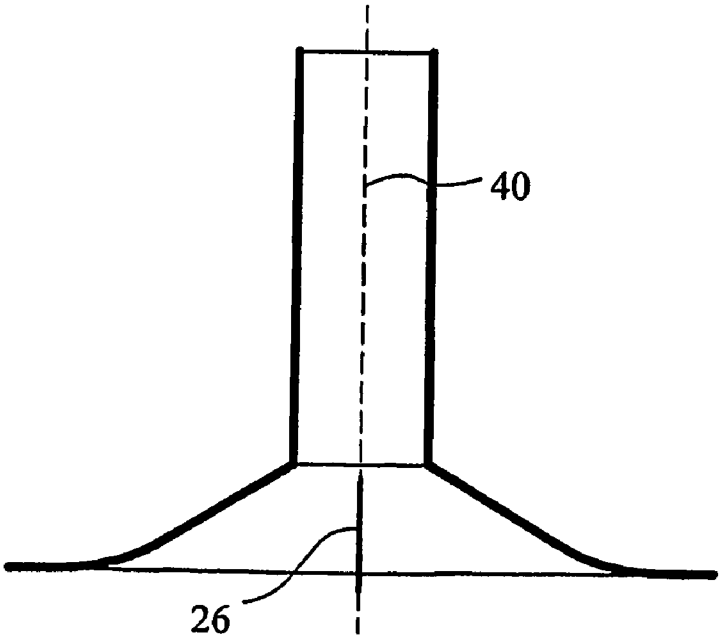
FIG. 2 is a planar cross-section of a second embodiment of a horn unit of the subject invention, the second embodiment differing from the first embodiment only in that the central linear vane extends parallel to the symmetrical axis.

A second embodiment, depicted in FIG. 2, differs from the first embodiment only in that the vane 26 extends along the intermediate symmetrical axis 40. The vane 26 in this embodiment may be fixed but may also be mounted to be pivotable around the upstream end as in the first embodiment.

The third embodiment (not shown) that was investigated also had a pivotable vane 26 extending parallel to the axis 40 (similar to FIG. 2) but laterally displaced from the axis rather than extending on the axis. The fourth embodiment (also not shown) had a pivotable vane 26 at an angle to the symmetrical axis 40 (similar to FIG. 1) but laterally displaced such that the upstream end of the vane 26 was no longer on the axis 40.

In the first embodiment (FIGS. 1, 3 and 4), the wave streams either side of the vane 26 were found to have different expansion rates as the acoustic wave propagated. An asymmetrical acoustic output existed either side of the vane, with the upper limiting frequency being largely the same on both sides. This conferred the same benefits as the second embodiment (FIG. 2), i.e. a broadly-identical frequency-response shape either side of the symmetrical axis 40 but featuring unequal amplitudes either side of that axis. This meant that the output of the horn was louder on one side, and hence the output was steered over a wide frequency range.

In the second embodiment (FIG. 2), wave streams either side of the vane 26 were found to have identical expansion rates as the acoustic wave propagated. As an "observation angle" (also referred to as a "listening angle", and defined as the horizontal angle between a listener and a main forward axis at which acoustic waves are being propagated) increased, the output from the horn 20 was incrementally greater with frequency than was the case when the vane 26 was not present; this held true up to a limiting frequency. Constant dispersion (directivity) was maintained up to the limiting frequency. Additionally, this effect was symmetrical about the main axis of propagation of the acoustic wave.

In the third embodiment (not shown), the acoustic wave streams either side of the vane 26 had different expansion rates as the acoustic wave propagated. The effect on the main (propagation) axis was a reduction of acoustic output. As the observation angle was increased on one side, the effect was a progressive reduction of the acoustic output. On the opposite side, as the observation angle was increased, there was a progressive increase in acoustic output. The frequency dependence of the effect was similar to that of the second embodiment except that the upper limiting frequency was not the same on both sides of the main axis, i.e. the shape of the frequency response was not the same on either side of the main axis.

In the fourth embodiment (not shown), a mixture of the effects of the first and third embodiments appeared to be present. An asymmetrical frequency response shape either side of the main axis was observed.

The first and second embodiments were thus found to be the most useful positions since they preserved the symmetry of the frequency response shape. The effect of consistent dispersion over a more extended frequency range, up to the limiting frequency, is common to these two positions. The difference between them is that the first embodiment rotates the acoustic axis (defined as the axis of maximum acoustic output) about the main axis in the plane where dispersion is being controlled.

The vane 26 has an upstream end 42 (FIG. 1) and a downstream end 44; those ends are also referred to as the start and stop edges, respectively. As far as the upstream end 42, it has been found that it must be positioned downstream of the plane that extends through an upstream end of the flared sides 22 and 24. The second-embodiment effects diminish rapidly when the upstream edge 42 is positioned upstream of the flared sides 22 and 24. As far as the position of the downstream end 44, it has been found that this influences the lower limit of the frequency range of both the first and second embodiments. The further away the downstream end 44 becomes from the upstream end 42, the lower the lower limit of the frequency range becomes. If the downstream end 44 becomes too far away from the upstream end 42, i.e. the vane 26 extends too far, there are unwelcome effects at higher frequencies. A balance needs to be struck therefore between the start of the effects and the preservation of the smooth-ness of the frequency response.

Figure 5:
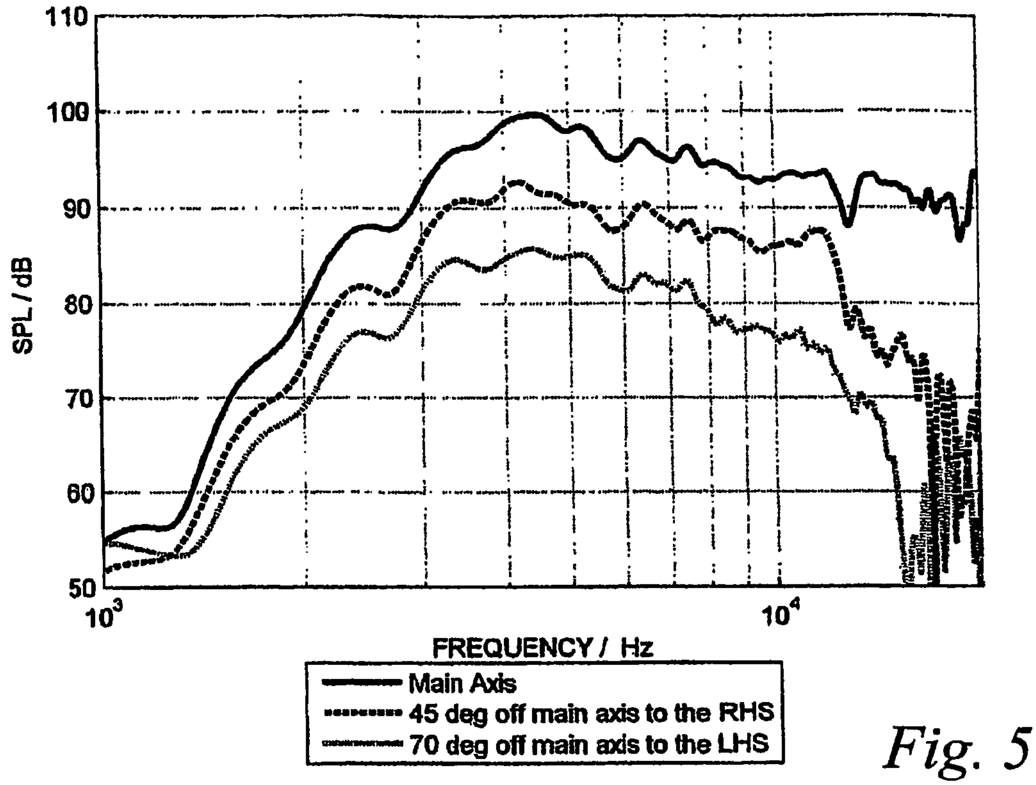
FIG. 5 is a graph of sound pressure level (SPL) versus frequency for a horn without a vane, the SPL being measured at three positions in front of the horn; and, FIG. 6 is a graph of sound pressure level versus frequency for a horn having a vane, the vane being set at an angle of 15° to the symmetrical axis, the SPL being measured at the same three positions as for FIG. 5.
Figure 6:
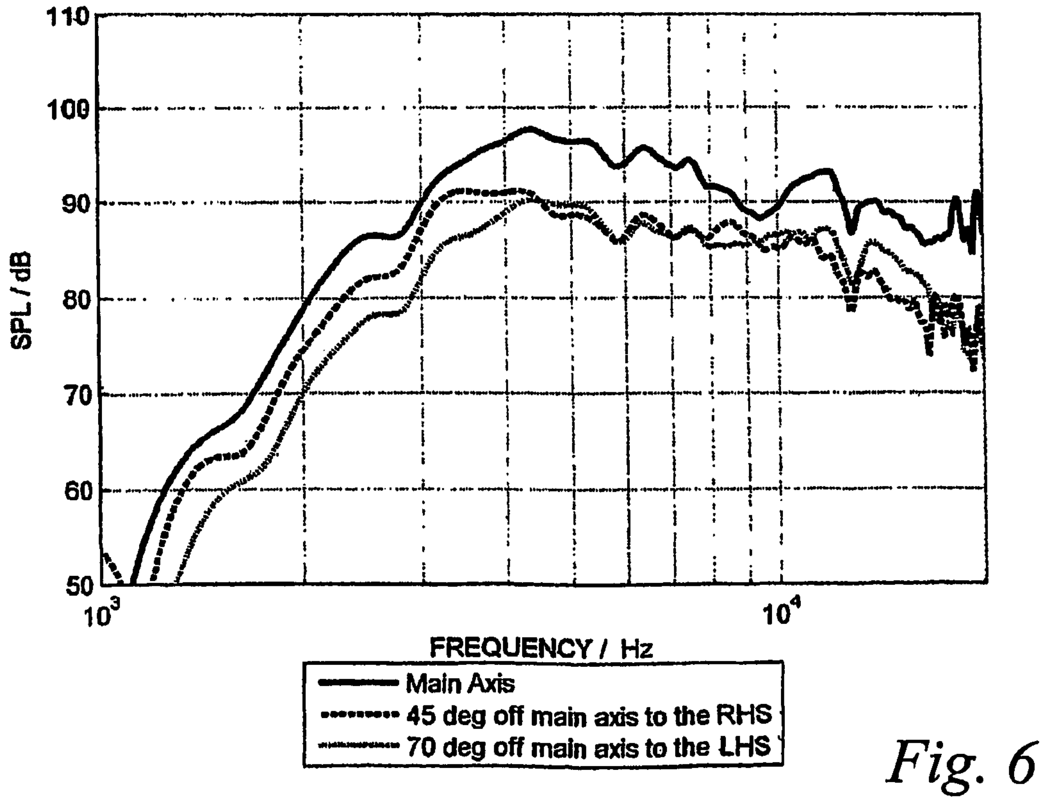

FIGS. 5 and 6 illustrate sound pressure level (SPL) measurements for, respectively, a horn without a vane and a horn with a vane. The measurements were taken at three positions forward of the horn, each position having a respective different orientation to the intermediate symmetrical axis 40. For the FIG. 6 measurements the vane extended at a 15° angle to the symmetrical axis 40; as with the vane of FIGS. 1, 3 and 4, the vane was "on the left-hand side" of the symmetrical axis when viewed from the front of the horn. The three positions of the measuring equipment forward of the horn were: (a) on the symmetrical (main) axis downstream, i.e. at a 0° angle; (b) at a 45° angle on the righthand side of the symmetrical axis 40; and, (c) at a 70° angle on the lefthand side of the symmetrical axis 40. From FIGS. 5 and 6 it can be seen that for the particular horn under study the presence of the vane improved the sound transmission from the horn at frequencies above about $2\times10^3$ Hz, with improvement increasing with frequency; the improvement at $10^4$ Hz is quite pronounced. SPL measurements are in decibels (dB).

Other measurements have been taken for a horn of scaled-up size; the vane of that horn when correspondingly scaled-up was 6 mm thick. In those measurements, SPL increases extended into the region below $2\times10^3$ KHz. Thus, it has been concluded that the vane thickness is related to the minimum wavelength of sound being dispersed, and that the relationship is that the thickness of the vane should be set to be no greater than approximately one-tenth of the minimum wavelength of sound to be dispersed through the horn.

It was found that edge shapes and various profiles imposed on the upstream end 42 and the downstream end 44 of the vane 26 were minor on the performance of the vane 26 compared to the parameters discussed above.

The second embodiment allows, for a given specification of dispersion angle and upper-limiting frequency, a substantially larger area for the upstream end of the horn 20. This has the beneficial effect of reducing the absolute pressure in the funnel 28, thereby reducing the overall distortion due to air non-linearity.

The first embodiment includes the benefit mentioned in the preceding paragraph, and additionally allows for the acoustic axis to be moved (steered) without moving a housing for the loudspeaker. The degree of steering of the acoustic wave is usefully wide and smoothly variable.

While the present invention has been described in its preferred embodiments, it is to be understood that the words which have been used are words of description rather than limitation, and that changes may be made to the invention without departing from its scope as defined by the appended claims.

Each feature disclosed in this specification (which term includes the claims) and/or shown in the drawings may be incorporated in the invention independently of other disclosed and/or illustrated features.

The text of the abstract filed herewith is repeated here as part of the specification.

A loudspeaker horn includes a pair of opposed flared sides defining a passage diverging to a mouth, and a vane positioned in the passage for steering sound waves through the passage. The vane may have a straight configuration and be either centrally located between the flared sides or laterally offset in the diverging passage. The vane may be fixed in position or, more preferably, be pivotable so as to be adjustable before each new use according to conditions at that use. The horn may be part of a horn unit that includes a funnel for feeding sound to the horn, and the horn or horn unit may be part of a horn loudspeaker.

The invention claimed is:

1. An acoustic loading device for a loudspeaker, the device having a sound passage defined by a pair of opposed, flared sides diverging to a mouth and having at least one generally planar vane disposed across the divergent passage so as in operation to affect the dispersion of sound from the device wherein the at least one vane has a thickness, said thickness being a dimension of said vane in a direction perpendicular to the plane of the vane, and said thickness being no greater than approximately one-tenth of the minimum wavelength of sound to be dispersed by the device, wherein each vane is pivotable about a pivot axis that extends parallel to the flared sides.

2. The device of claim 1, wherein each vane is located between the flared sides.

3. The device of claim 1, wherein a symmetrical axis extends intermediate the flared sides and wherein the device has a single vane that has a pivot axis on, or proximate, the symmetrical axis extending intermediate the flared sides.

4. The device of claim 1, wherein the device has a single vane that has a pivot axis located between one of the flared sides and the symmetrical axis extending intermediate the flared sides.

5. The device of claim 1, wherein the pivot axis of the at least one vane is proximate an upstream end of the vane.

6. The device of claim 1, wherein an upstream end of the at least one vane is downstream of an upstream end of the flared sides.

7. The device of claim 1, wherein a downstream end of each vane is downstream of a downstream end of the flared sides.

8. The device of claim 1, wherein the at least one vane has a thickness no greater than approximately 1 mm.

9. The device of claim 1, wherein the device is oriented in use such that at least one vane extends in a generally vertical direction.

10. The device of claim 1, wherein the device has a plurality of vanes.

11. The device of claim 10, wherein the pivot axes of each of the plurality of vanes extend generally parallel to one another.

12. The device of claim 1, wherein the at least one vane is straight.

13. The device of claim 1, wherein each flared side has an arcuate contour.

14. The device of claim 1, wherein the device is a horn for a horn loudspeaker.

15. A horn unit comprising the horn of claim 14, and also comprising a funnel connected to an upstream end of the horn.

16. The horn unit of claim 15, wherein, in one dimension the funnel is of constant width.

17. The horn unit of claim 16, wherein the funnel is of increasing depth in a direction normal to the one dimension, the depth increasing with decreasing distance from the upstream end of the horn.

18. A horn loudspeaker having the horn of claim 14.

* * * * *